(12) United States Patent
Ruha et al.

(10) Patent No.: US 7,239,183 B2
(45) Date of Patent: Jul. 3, 2007

(54) ACTIVE CURRENT MODE SAMPLING CIRCUIT

(75) Inventors: Antti Ruha, Oulu (FI); Jussi-Pekka Tervaluoto, Oulu (FI); Tarmo Ruotsalainen, Oulu (FI)

(73) Assignee: Nokia Corporation, Espoo (FI)

( * ) Notice: Subject to any disclaimer, the term of this patent is extended or adjusted under 35 U.S.C. 154(b) by 81 days.

(21) Appl. No.: 10/536,727

(22) PCT Filed: Sep. 29, 2003

(86) PCT No.: PCT/IB03/04246

§ 371 (c)(1),
(2), (4) Date: May 27, 2005

(87) PCT Pub. No.: WO2005/031755

PCT Pub. Date: Apr. 7, 2005

(65) Prior Publication Data

US 2006/0164131 A1 Jul. 27, 2006

(51) Int. Cl.
*G11C 27/02* (2006.01)
(52) U.S. Cl. .......................................... 327/95; 327/96
(58) Field of Classification Search ............ 327/94–96, 327/337
See application file for complete search history.

(56) References Cited

U.S. PATENT DOCUMENTS 5,689,201 A * 11/1997 Temes et al. ................. 327/95
5,963,156 A    10/1999 Lewicki et al. ............. 341/122
6,661,283 B1 * 12/2003 Lee ................................ 330/9

FOREIGN PATENT DOCUMENTS

WO       WO 01/24192 A1    4/2001

OTHER PUBLICATIONS

"A Complex Charge Sampling Scheme for Complex if Receivers" by S. Karvonen et al, Proceedings of the 2003 IEEE International Symposium on Circuits and Systems (Cat. No. 03CH37430), ISCAS 2003, International Symposium on Circuits and Systems, Bangkok, Thailand, May 25-28, 2003 pp. II-169-II-172.
"A Track & Hold-AGC Suitable for Downconversion by Subsampling" by T. Vasseaux, et al, ICECS'99, Proceedings of ICECS '99; 6th IEEE International Conference on Electronics, Circuits and Systems (Cat. No. 99EX357), ICECS'99; Proceedings of ICECS'99, 6th IEEE International Conference on Electronics, Circuits and Systems, Pafos, Cyprus, pp. 1527-1530,, 1999.

(Continued)

*Primary Examiner*—Kenneth B. Wells

(57) ABSTRACT

The invention relates to an active current mode sampling circuit comprising an operational amplifier (103) and at least one switched capacitor (C2, C2a, C2b). In order to reduce the power consumption of such a circuit, first switching elements (S101a, S101b, S102a, S102b) switch the switched capacitor (C2, C2a, C2b) between an input and an output of the operational amplifier (103) during charging phases φ1. Further, second switching elements (S103a, S103b, S104a, S104b) connect the switched capacitor (C2, C2a, C2b) during discharging phases φ2 to a subsequent stage (104), in order to provide a charge of the switched capacitor (C2, C2a, C2b) to the subsequent stage (104). The invention relates equally to a device (107) comprising such a sampling circuit and to a method of operating such a sampling circuit.

20 Claims, 11 Drawing Sheets

OTHER PUBLICATIONS

"A Charge Sampling Mixer Embedded Filter Function for Wireless Applications" by J. Yuan, 2nd International Conference on Microwave and Millimeter Wave Technology Proceedings, 2000.

High-Speed Low-Power Integrating CMOS Sample-and-Hold Amplifier Architecture, L. Carley et al, Custom Integrated Circuits Conference, 1995.

"Charge Sampling Mixer with ΔE Quantized Impulse Response" by S. Karvonen et al, IEEE International Symposium on Circuits and Systems 2002, vol. 1.

"Analysis and Realization of a Downconverting Quadrature Sampler", by S. Karvonen, Diploma Thesis, University of Oulu, 2001.

"CMOS Baseband Integrated Circuit Techniques for Radio Receivers" by S. Lindfors, Doctoral thesis, Helsinki University of Technology, Jul. 2000.

"A Low Noise Quadrature Subsampling Mixer" by S. Karvonen, et al, IEEE International Symposium on Circuits and Systems 2001, vol. 4.

* cited by examiner

ACTIVE CURRENT MODE SAMPLING CIRCUIT

CROSS-REFERENCE TO RELATED APPLICATION

This is the U.S. National Stage of International Application No. PCT/IB2003/004246 filed Sep. 29, 2003 and published in English on Apr. 7, 2005 under International Publication No. WO 2005/031755 A1.

FIELD OF THE INVENTION

The invention relates to an active current mode sampling circuit comprising an operational amplifier and at least one switched capacitor. The invention relates equally to a device comprising such a sampling circuit and to a method of operating such a sampling circuit.

BACKGROUND OF THE INVENTION

Sampling circuits are known from the state of the art. A sampling circuit can be employed for example in a receiver for sampling received signals.

A conventional receiver is usually implemented with complicated analog techniques and using BiCMOS (bipolar complementary metal-oxide semiconductor) or other analog-oriented semiconductor.

For illustration, a block diagram of an exemplary analog direct conversion receiver is presented as FIG. 1.

The depicted receiver comprises a low noise amplifier (LNA) 10 for amplifying received radio frequency (RF) signals, mixers 11 for downconverting the amplified RF signals, an analog signal processing component 12 for processing the downconverted signals, analog-to-digital converters (ADC) 13 for converting the processed analog signals into digital signals, and a digital signal processing component (DSP) 14 for further processing of the digital signals. For processing the analog downconverted signal, the analog signal processing component 12 comprises an Nth-order low-pass filter (LPF), an analog gain control (AGC), a direct-current (DC) offset cancellation, etc. For processing the digital signal, the DSP 14 comprises a decimation stage, an LPF, etc. The output of the DSP 22 constitutes the digital baseband (BB) output.

This kind of receiver requires high-order analog base band filters to attenuate undesired signals, and at the same time, it has a high in-band amplification. Depending on the involved system, e.g., GSM (global system for mobile communications), CDMA (code division multiple access), WCDMA (wideband CDMA), etc., up to seventh-order analog filters may be required. In addition to the complicated filter, also an accurate AGC is needed in order to relax ADC requirements in terms of sampling frequency, dynamic range and related silicon costs. To this end, a large number of high quality resistors and capacitors is needed in the implementation. Due to large temperature dependency and process variations of the resistor-capacitor (RC) time constants, often some kind of calibration or tuning is required in addition. Moreover, high quality resistors require additional mask layers, which also increase the costs of the production process.

Due to cost reasons, it is therefore often desirable to increase the integration level by digitalization, that is, to implement RF receivers and analog input interface circuits in a pure digital semiconductor process, for example in a deep sub-micron CMOS, together with the digital signal processing blocks. Also to support this trend, circuit techniques are being developed that enable signal processing functions, which are conventionally implemented in the analog domain, like filtering, to be implemented with digital techniques.

A block diagram of a more digital implementation of a direct conversion receiver is presented as FIG. 2.

The receiver of FIG. 2 comprises again an LNA 20 for amplifying received RF signals. Further, it comprises a first integrated processing component 21 for processing the received analog signals. This processing includes a frequency down conversion, an analog pre-filtering and an analog-to-digital conversion by ADCs. The receiver comprises in addition a DSP 22 for processing the resulting digital signals. The DSP 22 realizes more specifically a decimation, a low-pass filtering, an automatic gain control, a direct-current (DC) offset cancellation, etc. The output of the DSP 22 constitutes the digital baseband (BB) output.

The benefits of the digitalization of the RF and analog interface circuits include an increased integration level, a size reduction with time through process technology shrinkage, an increased flexibility and adaptability of the circuits, shorter design cycles which are made possible through design synthesis, portability and reuse of the circuits, an ease of the implementation of the complex signal processing in the digital domain, less calibration in the production, and a better control of performance.

One approach for realizing a digitalization of an RF receiver is utilizing a subsampling technique, where the frequency downconversion and the sampling are combined and performed by a voltage mode sampling operation. This solution, however, has the drawback that it still needs a continuous time antialias filter. Actually, a voltage mode sampling operation makes the antialias filter implementation even more complicated compared to the conventional direct conversion RF receiver, because it requires a very selective bandpass filter at the RF frequencies.

A more promising approach for realizing a digitalization of an RF receiver by a system-on-chip (SoC) solution is utilizing a current mode sampling operation, which is also called charge sampling. The current mode sampling has several advantages over the voltage mode sampling. A current mode sampling operation contains an inherent antialias filtering. Therefore the additional antialias filter needed in conventional voltage mode sampling can be avoided. The antialias filter frequency response does not have to be calibrated, because it is proportional to the capacitor ratio and the clock frequency, which are among the best-controlled parameters in the analog semiconductor integration. A current mode sampling operation is moreover suitable for an implementation with a pure digital deep-submicron CMOS process, because additional mask layers needed for high quality resistors can be avoided. Further, the frequency down-conversion can be combined easily with the current mode sampling circuit.

The operational principle of a current mode sampling without frequency down-conversion is illustrated by the schematic circuit of FIG. 3. The circuit comprises a transconductance element (GM) 30, which is connected via a first switching element S31 and a second switching element S32 to an output. Between the first switching element S31 and the second switching element S32, a sampling capacitor C30 and a third switching element 33 are connected in parallel to each other to ground.

The transconductance element 30 converts an input voltage mode signal VIN into a current mode signal. The first switching element S31 is closed during an integration period φ1, and the current mode signal is integrated by the sampling capacitor C30 during this integration period φ1. After the integration period φ1, the resulting voltage across capacitor C30 is then sampled by the subsequent stages for further processing. The resulting voltage VOUT is provided to subsequent stages more specifically by closing the second switching element S32 during a discharging period φ2. Before the next integration period φ1 is entered for a new sample, the sampling capacitor C30 is reset by closing the third switching element S33.

FIG. 4 presents a current mode sampling circuit with frequency down-conversion, in which a transconductance element 40, switching elements S41, S42 and S43 and a sampling capacitance C40 are arranged in the same manner as in FIG. 3. In the circuit of FIG. 4, however, a switching element S44, which performs the frequency down-conversion, is inserted between the transconductance element 40 and the actual sampling circuit with elements C40, S41, S42 and S43. The switching element S44 is controlled by a local oscillator signal LO.

The transconductance element 40 converts an input RF voltage mode signal VRF into a current mode signal. The resulting current mode signal is then frequency down-converted by the switching element S44. The purpose of the down-conversion is to bring the current signal provided by the transconductance element 40 from the radio frequency down to a frequency range in which it can be sampled with sufficient performance, e.g. to an intermediate frequency (IF) or to the base band (BB), as indicated in the diagram of FIG. 5. The subsequent sampling is the same as in the circuit of FIG. 3. That is, switching element S41 is closed during integration periods φ1 such that the current mode signal is integrated by the sampling capacitor C40. The resulting BB or IF voltage VBB/VIF across capacitor C40 is provided to subsequent stages by closing the second switching element S42 during discharging periods φ2. Before the next integration period φ1, the sampling capacitor C40 is reset by closing the third switching element S43.

Such a current mode sampling has been presented for example by Jiren Yuan in: "A Charge Sampling Mixer With Embedded Filter Function for Wireless Applications", 2nd International Conference on Microwave and Millimeter Wave Technology Proceedings, 2000, by Karvonen S. in: "Analysis and Realization of a Downconverting Quadrature Sampler", Diploma Thesis, University of Oulu, 2001, by Karvonen S., Riley T. and Kostamovaara J. in: "A Low Noise Quadrature Subsampling Mixer", IEEE International Symposium on Circuits and Systems 2001, Volume 4, and by Karvonen S., Riley T. and Kostamovaara J. in: "Charge Sampling Mixer With DS Quantized Impulse Response", IEEE International Symposium on Circuits and Systems 2002, volume 1.

The integration of a current mode signal over a given period of time produces a SINC=sin(x)/x type of frequency domain transfer function, which has transmission zeros at the sampling frequency Fs and its multiples 2Fs, 3Fs, etc. Thus, the transfer function zeros create an inherent anti-alias filter for the sampling operation. That is, folding interferences and noise are filtered due to the inherent antialias filtering. The transfer function and the aliasing of the current mode sampling are sketched in FIG. 6. As can be seen, the transfer function has a significant attenuation of the aliasing frequency bands, i.e. around the zeros at Fs, 2Fs, 3Fs, etc., especially near the sampling frequency Fs. Therefore, a current mode sampling is well suited for use with over-sampling ADCs, in which the signal band is narrow compared to the sampling frequency.

On the whole, it is to be understood that the current mode sampling does not constitute a kind of sub-sampling, and thus, it does not have the problems associated with, for example, voltage mode RF sub-sampling.

FIG. 7 presents a straightforward implementation of the passive current mode sampling with frequency down conversion as shown in FIG. 4. In FIG. 7, the passive current mode sampling and the frequency down conversion are further combined with a switched-capacitor integrator for low-pass filtering.

The circuit of FIG. 7 thus comprises a transconductance element 70, a frequency down-conversion portion 71, a sampling portion 72 and an LPF portion 75.

The transconductance element 70 has two inputs and two outputs, the latter being connected to the frequency down-conversion portion 71. The frequency down-conversion portion 71 comprises four switches which are controlled by a local oscillator.

In the sampling portion 72, a first path is realized, which connects a first output of the frequency down-conversion portion 71 via a switch S71a, a sampling capacitor Csa and a switch S72a to a first output of the sampling portion 72. In this first path, the first output of the frequency down-conversion portion 71 is further connected via a capacitor Cia to ground Vcm. In addition, the connection between switch S71a and capacitor Csa is connected via a switch S73a to ground Vcm, while the connection between capacitor Csa and switch S72a is connected via a switch S74a to ground Vcm. The second output of the frequency down-conversion portion 71 is connected in exactly the same manner via a second path realized in the sampling portion 72 to a second output of the sampling portion 72. In the second path, corresponding capacitors are named Csb and Cib instead of Csa and Cia, respectively, and corresponding switches are named S71b to S74b instead of S71a to S74a, respectively.

The capacitors Csa and Csb and the switches S71a to S74a and S71b to S74b of the first and the second path form a first sampler 73. Additionally, identical samplers 74 etc. may be connected in parallel to the first sampler 73.

The LPF portion 75 comprises an operational amplifier 76.

The first output of the sampling portion 72 is connected via a first input of the LPF portion 75 to a first input of operational amplifier 76, and a first output of operational amplifier 76 is connected to a first output of the LPF portion 75. A capacitor C1a on the one hand and a series connection of a switch S75a, a capacitor C2a and a switch S76a on the other hand are arranged in parallel to each other between the first input and the first output of operational amplifier 76. The connection between switch S75a and capacitor C2a is connected via a switch S77a to ground Vcm, while the connection between capacitor C2a and switch S76a is connected via a switch S78a to ground Vcm.

The second output of the sampling portion 72 is connected to a second input of the LPF portion 75. The second input and output of operational amplifier 76 are connected to the second input of the LPF portion 75 and a second output of the LPF portion 75, respectively, and corresponding components are connected directly and indirectly to the second input and output of operational amplifier 76 as to the first input and output of operational amplifier 76. Corresponding capacitors are named C1b and C2b instead of C1a and C2a, respectively, and corresponding switches are named S75b to S78b instead of S75a to S78a, respectively.

Transconductance element 70 converts two input RF voltage mode signals into RF current mode signals and provides them to the frequency down conversion portion 71. A separate LNA (not shown) can be used in front of transconductance element 70. Alternatively, the transconductance element 70 could be either an integral part of an LNA or of the frequency down-conversion portion 71. However, in any implementation one or more semiconductor devices can be recognized that provide the function of a transconductor.

The local oscillator provides alternating signals LO+ and LO− to the switches of the frequency down conversion portion 71. When the LO+ signal is active, the outputs of the transconductance element 70 are connected to the sampling portion 72 in a direct way, i.e. the first output of the transconductance element 70 is connected to the first path of the sampling portion 72, while the second output of the transconductance element 70 is connected to the second path of the sampling portion 72. When the LO− signal is active, the outputs of the transconductance element 70 are connected to the sampling portion 72 in a cross-coupled way, i.e. the first output of the transconductance element 70 is connected to the second path of the sampling portion 72, while the second output of the transconductance element 70 is connected to the first path of the sampling portion 72. With this operation, the RF current signals output by the transconductance element 70 are frequency down-converted into IF current signals.

In the sampling portion 72, switches S71$a$, S74$a$, S71$b$ and S74$b$ are closed during a clock phase φ1, while switches S72$a$, S73$a$, S72$b$ and S73$b$ are closed during a clock phase φ2. Clock phases φ1 and φ2 are alternating with each other.

The signal current is thus integrated by the sampling capacitors Csa and Csb during a respective clock phase φ1. The sampling is said to be passive, as no operational amplifier participates in the integration. The sampling capacitors Csa and Csb are then discharged to zero during a charge transfer from the capacitors Csa and Csb to the LPF portion 76 during a respective clock phase φ2. Therefore, an additional reset phase is not needed for discharging the switched capacitors Csa and Csb before the respective next sampling phase. The capacitors Cia and Cib are needed to avoid a shifting of the transfer function zeros due to the non-overlap time of the sampling. In addition, the capacitors Cia and Cib are also used to attenuate RF blockers and interferences.

Alternatively, switches S71$a$, S72$a$, S71$b$ and S72$b$ could be closed during a clock phase φ1, while switches S73$a$, S74$a$, S73$b$ and S74$b$ are closed during a clock phase φ2. In this case, the charge transfer to the LPF portion 76 takes place during the charging of the capacitors Csa and Csb in a respective clock phase φ1, while clock phase φ2 is a pure discharging phase.

Parallel samplers 74 can be used in order to reduce the sampling clock frequency or to build an analog FIR (finite impulse response) filter sampling stage.

The LPF portion 75 then performs a low-pass filtering on the received current samples. To this end, switches S75$a$, S76$a$, S75$b$ and S76$b$ are closed in the respective clock phase φ1, while switches S77$a$, S78$a$, S77$b$ and S78$b$ are closed in the respective clock phase φ2.

The power consumption of operational amplifier 76 of the LPF portion 75 can be reduced by a modification as presented in FIG. 8.

The circuit of FIG. 8 comprises exactly the same components as the circuit of FIG. 7, except that the capacitors C2$a$ and C2$b$ and the switches S75$a$ to S78$a$ and S75$b$ to S78$b$ are removed. Moreover, switch S73$a$ in the first depicted path of the sampling portion 72 is no longer connected to ground Vcm, but instead to the first output of operational amplifier 76. The connection between switch S73$a$ and the capacitor Csa is connected within the sampling portion 72 via a switch S81$a$ to the connection between switch S74$a$ and the capacitor Csa. A corresponding arrangement is introduced between the second output of operational amplifier 76 and the second depicted path in the sampling portion 72, including switch S81$b$. The outputs of the operational amplifier 76 are moreover connected in the same manner in parallel to the first and the second paths in any possible further sampler 74.

The sampling operation is similar to the sampling operation in the circuit of FIG. 7. In this case, however, capacitors Csa and Csb are charged during a respective clock phase φ1, connected to operational amplifier 76 during a respective clock phase φ2, and discharged during a respective additional reset clock phase φr by closing switches S81$a$ and S81$b$.

Compared to the circuit of FIG. 7, a lower power consumption is achieved, since the workload of operational amplifier 76 is relaxed in the charge transfer clock phase φ2 due to the modified switching topology. The main drawback of this circuit is, however, that the additional reset clock phase φr is needed for discharging the switched capacitors Csa and Csb before the respective next sampling. Due to the additional reset clock phase φr, parallel samplers 74 are required in addition to sampler 73.

In a passive current mode sampling, the current consumption of the operational amplifier of an LPF portion could also be reduced by means of a decimation circuit as presented by S. Lindfors in: "CMOS Baseband Integrated Circuit Techniques for Radio Receivers", doctoral thesis, Helsinki University of Technology, July 2000. In that topology, the sampling frequency of a switched capacitor connected to the operational amplifier can be smaller than the input sampling frequency of the current mode sampling, resulting in lower bandwidth requirements for the operational amplifier.

A serious drawback of a passive current mode sampling in general, however, results from the common use of transistors as switches.

Transistors in modern semiconductor processes have a low output impedance, such that also the employed transconductance elements in the presented circuits have a low output impedance. This low output impedance causes a leakage of the transfer function zeros and thus degrades the advantageous anti-alias filter properties of the current mode sampling. The problem becomes severe, when the passive current mode sampling is implemented using components available in digital deep-sub micron CMOS processes, where the output impedance of the realized components is inherently low.

Another serious drawback resulting from the low output impedance is poor linearity for the third order intercept point, IIP3. As the integrated voltage in the sampling capacitors, and thus the voltage at the output of the mixer and in some cases also of the transconductance element, is a function of the input signal, a signal dependent distortion is introduced due to channel modulation effects in the mixing transistors of the frequency down-conversion portion.

A known circuit topology that circumvents the problem resulting from the low output impedance of the transconductance element and from the non-linearity of the transistors mixing the RF signal is shown in FIG. 9, which enables an active current mode sampling instead of a passive current mode sampling.

The circuit of FIG. 9 comprises as well a transconductance element 90 for converting RF voltage mode signals into RF current mode signals and a frequency down-conversion portion 91 for frequency down-converting the RF current signals into IF current signals, as described above with reference to FIG. 7. In addition, the circuit of FIG. 9 comprises a sampling and LPF portion 92 and a following switched-capacitor (SC) block 94 realizing a part of an ADC or an SC-filter.

The sampling and LPF portion 92 comprises an operational amplifier 93. The first output of the frequency down-conversion portion 91 is connected via a first input of the sampling and LPF portion 92 to a first input of operational amplifier 93, and a first output of operational amplifier 93 is connected to a first output of the sampling and LPF portion 92. A capacitor C1a on the one hand and a series connection of a switch S91a, a capacitor C2a and a switch S92a on the other hand are arranged in parallel to each other between the first input and the first output of operational amplifier 93. The connection between switch S91a and capacitor C2a is connected via a switch S93a to ground Vcm, while the connection between capacitor C2a and switch S92a is connected via a switch S94a to ground Vcm.

The second output of the frequency down-conversion portion 91 is connected to a second input of the sampling and LPF portion 92. A second input and output of operational amplifier 93 are connected to the second input of the sampling and LPF portion 92 and a second output of the sampling and LPF portion 92, respectively, and corresponding components are connected directly and indirectly to the second input and output of operational amplifier 93 as to the first input and output of operational amplifier 93. Corresponding capacitors are named C1b and C2b instead of C1a and C2a, respectively, and corresponding switches are named S91b to S94b instead of S91a to S94a, respectively.

The components of the sampling and LPF portion 92 form an active switched-capacitor integrator.

The first output of the sampling and LPF portion 92 is connected within the SC block 94 via a switch S95a, a sampling capacitor C4a and a switch S96a to a first input of an operational amplifier 95. In addition, the connection between switch S95a and capacitor C4a is connected via a switch S97a to ground Vcm, while the connection between capacitor C4a and switch S96a is connected via a switch S98a to ground Vcm. The second output of the of the sampling and LPF portion 92 is connected within the SC block 94 in exactly the same manner to a second input of operational amplifier 95. A corresponding capacitor is named C4b instead of C4a, and corresponding switches are named S95b to S98b instead of S95a to S98a, respectively.

A respective capacitor C3a, C3b is arranged between the first input and a first output of the operational amplifier 95 and between the second input and a second output of the operational amplifier 95. Further elements may be connected in parallel to the respective capacitor C3a, C3b for realizing the desired functions.

In the sampling and LPF portion 92, switches S91a, S92a, S91b and S92b are closed during a clock phase φ1, while switches S93a, S94a, S93b and S94b are closed during a clock phase φ2. Capacitors C2a and C2b are therefore charged during a respective clock phase φ1 and discharged to zero during a respective clock phase φ2, the latter constituting a dedicated reset clock phase. Clock phases φ1 and φ2 are alternating with each other.

The current mode signals provided by the frequency down-conversion portion 92 are thus integrated by the active switched-capacitor integrator of the sampling and LPF portion 92, which provides a virtual short circuit at the sampler input. The switched-capacitor integrator does not allow the output voltage of the frequency down conversion portion 91 and, in some cases, of the transconductance element 90 to vary, as the signals are in a current mode. Therefore, a leakage of the transfer function zeros due to the small output impedance is eliminated and better quality anti-alias filtering properties are obtained. In addition, as the voltage swing is practically negligible, a better linearity (IIP3) is obtained. With the shown switched-capacitor integrator, or alternatively with another higher order filter, also the RF blockers are attenuated.

In the SC block 94, switches S95a, S96a, S95b and S96b are closed during a clock phase φ1, while switches S97a, S98a, S97b and S98b are closed during a clock phase φ2. Sampling capacitors C4a and C4b are therefore charged during the respective clock phase φ1 and discharged to zero during the respective clock phase φ2. The sampled signal is then further processed as desired by the operational amplifier 95.

It is a disadvantage of the circuit of FIG. 9 that it involves a high power consumption as, for example, power is wasted during the reset clock phase φ2. The power consumption is heavily dependent on the switching frequency and on the capacitance values of capacitors C2a and C2b on the one hand and C4a and C4b on the other hand. The problem is that while it is desirable to have a low switching frequency for achieving a low power consumption, it is desirable to have a high switching frequency for a wide bandwidth of the transfer function zeros relative to the signal bandwidth.

Due to the high power consumption, an active current mode sampling is currently only used for sampling an IF input signal, as described in the above mentioned document "A Charge Sampling Mixer With Embedded Filter Function for Wireless Applications".

SUMMARY OF THE INVENTION

It is an object of the invention to enable an improved active current mode sampling. It is in particular an object of the invention to reduce the power consumption of active current mode sampling circuits. It is further an object of the invention to reduce the noise in an active current mode sampling.

An active current mode sampling circuit is proposed which comprises an operational amplifier, at least one switched capacitor and first switching elements for switching the at least one switched capacitor between an input and an output of the operational amplifier during charging phases and for disconnecting the at least one switched capacitor from the input and the output of the operational amplifier in between the charging phases. The proposed active current mode sampling circuit further comprises second switching elements for connecting the at least one switched capacitor during discharging phases in between the charging phases to a subsequent stage, in order to provide a charge of the at least one switched capacitor to the subsequent stage, and for disconnecting the at least one switched capacitor from the subsequent stage in between the discharging phases.

Moreover, a device is proposed, which comprises the proposed active current mode sampling circuit. The device can be for example a receiver of a radio system or a terminal comprising such a receiver.

Moreover, a method of operating an active current mode sampling circuit is proposed, which active current mode sampling circuit includes an operational amplifier and at least one switched capacitor. The proposed method comprises switching the at least one switched capacitor between an input and an output of the operational amplifier during charging phases. The proposed method further comprises disconnecting the at least one switched capacitor from the input and the output of the operational amplifier in between these charging phases. The proposed method further comprises connecting the at least one switched capacitor during discharging phases in between the charging phases to a subsequent stage, in order to provide a charge of the at least one switched capacitor to this subsequent stage. Finally, the proposed method comprises disconnecting the at least one switched capacitor from the subsequent stage in between the discharging phases.

The invention proceeds from the consideration that the signal voltage at the output of an operational amplifier is also available across a switched capacitor which is connected during charging phases between an input and an output of the operational amplifier. Therefore, it is proposed to use such a capacitor to transfer a charge to a following stage within the active current mode sampling circuit or outside of the active current mode sampling circuit. The operational amplifier and the switched capacitor in the feedback path of the operational amplifier can be for example part of a switched capacitor integrator realizing a low-pass filtering, and in the proposed configuration, the switched capacitor is used at the same time as sampling capacitor.

It is an advantage of the invention that it makes the capacitive loading of the operational amplifier smaller, which results in a lower power consumption for a given sampling frequency. Alternatively, the sampling frequency could be increased without increasing the power consumption. Due to the increased power efficiency, the possible operational area of an active current mode sampling circuit is increased. It becomes possible, for example, to use an active current mode sampling circuit as well for direct conversion receivers and broadband applications. Further, the lower power consumption enables an implementation in deep sub-micron semiconductor processes with low supply voltage. It may even allow to integrate an entire receiver on a single chip.

It is further an advantage of the invention that the number of components of the sampling circuit is reduced, as an additional sampling capacitor connected to an output of the operational amplifier is not required any more. As a result, the thermal noise power is lower compared to the known active current mode sampling.

The proposed arrangement of the sampling switched capacitor in the feedback path of the operational amplifier further ensures that the total noise is reduced, as the DC offset and the low frequency noise, for instance the flicker noise of the operational amplifier, see a relatively lower gain compared to the signal gain than in known active current mode sampling circuits.

Just like the known active current mode sampling circuits, also the proposed active current mode sampling circuit ensures that the value and thus the area of the capacitors realizing a low-pass filter, e.g. a BB low-pass filter, can be smaller compared to passive current mode sampling and conventional mixer/filter interfaces.

Preferred embodiments of the invention become apparent from the detailed description below.

The proposed active current mode sampling circuit may comprise in addition a transconductance portion converting an available voltage mode signal into a current mode signal, and a frequency down-conversion portion applying a frequency down-conversion on this current mode signal before providing it to the operational amplifier. Like the known active current mode sampling circuit, the proposed configuration ensures a low voltage swing at the output of the transconductance portion and of the frequency down-conversion portion, and a good linearity (IIP3) of the frequency down-conversion portion, even if transistors in a deep sub-micron CMOS process having an inherently low output impedance are employed as switching elements. For some applications, for instance for audio and measurement applications, a frequency conversion is not needed, so that the frequency down-conversion portion may be omitted In this case, the current mode signal output by the transconductance portion is provided directly to the operational amplifier.

Advantageously, a gain control is provided, which adjusts the capacitance in the feedback path of the operational amplifier in accordance with a required gain.

The invention can be used for example in direct conversion or in any IF receiver, e.g. in a low-IF receiver or a heterodyne receiver etc., of any radio system.

The invention can be employed for example in RF circuits using digital or analog CMOS technologies. In these cases, the transconductance portion can be realized in particular with a mixer. When such a mixer is substituted by a transconductor, the invention can also be integrated for instance in audio or instrumentation circuits.

The invention is of particular advantage for a pure submicron digital CMOS process, without any additional process options.

BRIEF DESCRIPTION OF THE FIGURES

Other objects and features of the present invention will become apparent from the following detailed description considered in conjunction with the accompanying drawings.

DETAILED DESCRIPTION OF THE INVENTION

Figure 10:
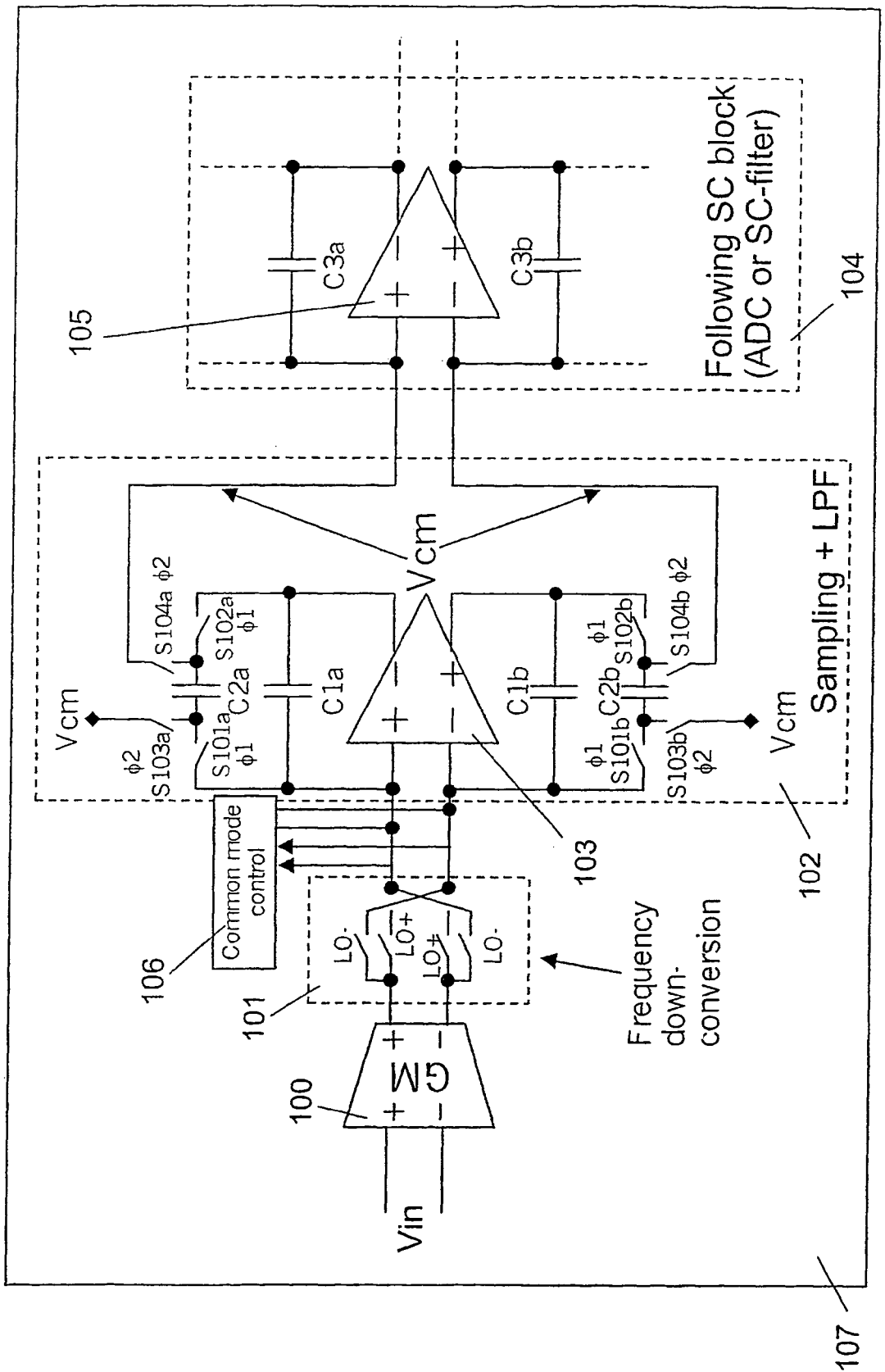
FIG. 10 is a schematic diagram of a circuit for an active low power current mode sampling with frequency down-conversion according to an embodiment of the invention.

FIG. 10 is a schematic diagram of an exemplary circuit enabling an active current mode sampling in accordance with the invention. The circuit can be implemented for example in a receiver 107.

The circuit of FIG. 10 comprises a transconductance element 100, for instance in form of a mixer, a frequency down-conversion portion 101, a sampling and LPF portion 102, and a following SC block 104, realizing for example an ADC and/or some SC filter.

The transconductance element 100 has two inputs and two outputs, the latter being connected to the frequency down-conversion portion 101. The frequency down-conversion portion 101 comprises switches which are controlled by signals LO+ and LO− of a local oscillator (not shown).

The sampling and LPF portion 102 comprises an operational amplifier 103. The first output of the frequency down-conversion portion 101 is connected via a first input of the sampling and LPF portion 102 to a first input of operational amplifier 103. A capacitor C1a on the one hand and a series connection of a switch S101a, a shared switched capacitor C2a and a switch S102a on the other hand are arranged in parallel to each other between the first input and a first output of operational amplifier 103. The connection between switch S101a and capacitor C2a is connected via a switch S103a to ground Vcm, while the connection between capacitor C2a and switch S102a is connected via a switch S104a to a first output of the sampling and LPF portion 102.

The second output of the frequency down-conversion portion 101 is connected via a second input of the sampling and LPF portion 102 to a second input of operational amplifier 103. Corresponding components are connected directly and indirectly to the second input and a second output of operational amplifier 103 as to the first input and output of operational amplifier 103. Corresponding capacitors are named C1b and C2b instead of C1a and C2a, respectively, and corresponding switches are named S101b to S104b instead of S101a to S104a, respectively.

In the following, the term capacitor C1 refers to either of capacitors C1a and C1b, while the term capacitor C2 refers to either of capacitors C2a and C2b. Similarly, the term switch S101 refers to either of switches S101a and S101b, the term switch S102 refers to either of switches S102a and S102b, the term switch S103 refers to either of switches S103a and S103b, and the term switch S104 refers to either of switches S104a and S104b.

The components of the sampling and LPF portion 102 form an active switched-capacitor integrator.

The first output of the sampling and LPF portion 102 is connected within the SC block 104 to a first input of an operational amplifier 105. The second output of the sampling and LPF portion 102 is connected within the SC block 104 to a second input of operational amplifier 105.

A respective capacitor C3a, C3b is arranged between the first input and a first output of operational amplifier 105 and between the second input and a second output of operational amplifier 105. Further elements may be connected in parallel to the respective capacitor C3a, C3b, in order to realize the desired function.

In addition, a common mode control portion 106 is provided, which is connected to the connections between the frequency down-conversion portion 101 and the sampling and LPF portion 102. The common mode control portion 106 measures the common mode voltage of the operational amplifier 103 and keeps this common mode voltage within a correct operational range.

All switching elements are, by way of example, transistors realized in a deep sub-micron CMOS process.

Transconductance element 100 first converts two input RF voltage mode signals into RF current mode signals and provides them to the frequency down conversion portion 101.

The local oscillator provides alternating signals LO+ and LO− to the switches of the frequency down conversion portion 101. When the LO+ signal is active, the outputs of the transconductance element 100 are connected to the sampling and LPF portion 102 in a direct way, i.e. the first output of the transconductance element 100 is connected to the first path of the sampling and LPF portion 102, while the second output of the transconductance element 100 is connected to the second path of the sampling and LPF portion 102. When the LO− signal is active, the outputs of the transconductance element 100 are connected to the sampling and LPF portion 102 in a cross-coupled way, i.e. the first output of the transconductance element 100 is connected to the second path of the sampling and LPF portion 102, while the second output of the transconductance element 100 is connected to the first path of the sampling and LPF portion 102. With this operation, the RF current signals output by the transconductance element 100 are frequency down-converted converted into base band current signals.

In the sampling and LPF portion 102, the received base band current mode signal is integrated by the combination of continuous time capacitor C1 and shared switched capacitor C2, which are connected in parallel to each other in the feedback loop of operational amplifier 103. Switches S101 and S102 are closed during a clock phase φ1, while switches S103 and S104 are closed during a clock phase φ2. Clock phases φ1 and φ2 are alternating with each other. Capacitor C2 is therefore only charged during a respective clock phase φ1.

The signal voltage at the operational amplifier 103 output is also available across shared switched capacitor C2. Therefore it is possible to use capacitor C2 to transfer a charge to the following SC block 104 during a respective clock phase φ2 in between the charging clock phases φ1. When the charge from capacitor C2 is transferred to the following SC block 104 during a respective clock phase φ2, it is simultaneously discharged and, thus, no additional reset phases and switches are needed.

Figure 1:
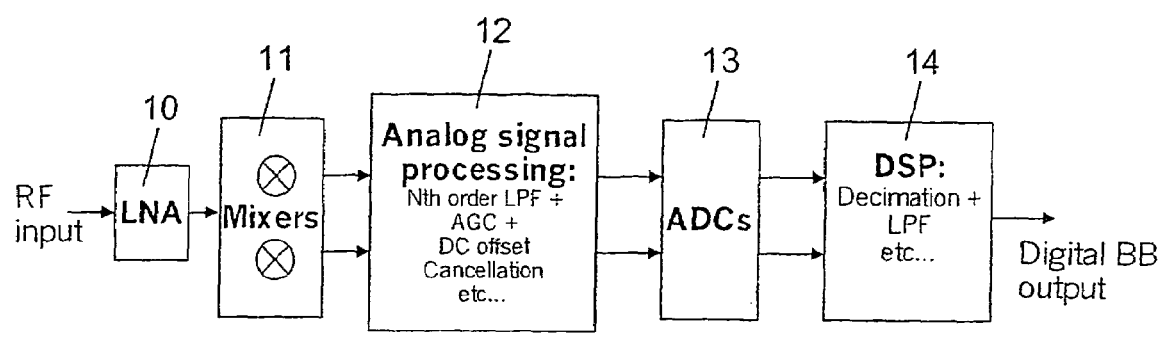
FIG. 1 is a block diagram of a conventional direct conversion receiver.
Figure 2:
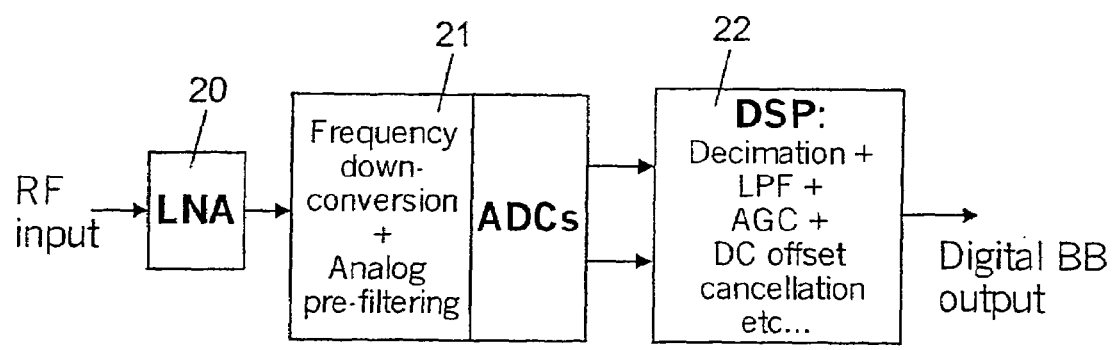
FIG. 2 is a block diagram of a conventional digitized direct conversion receiver.
Figure 3:
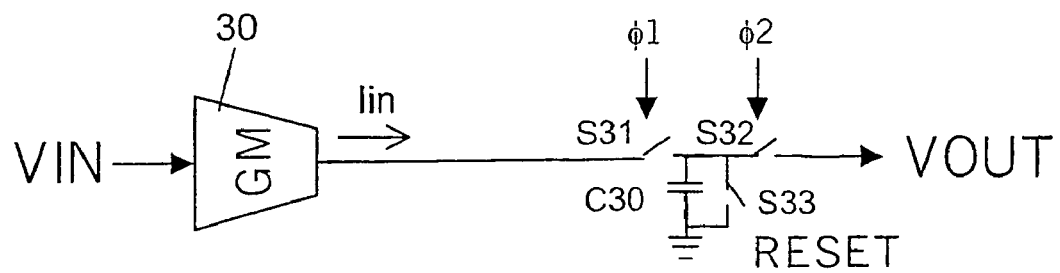
FIG. 3 illustrates the principle of a current mode sampling.
Figure 4:
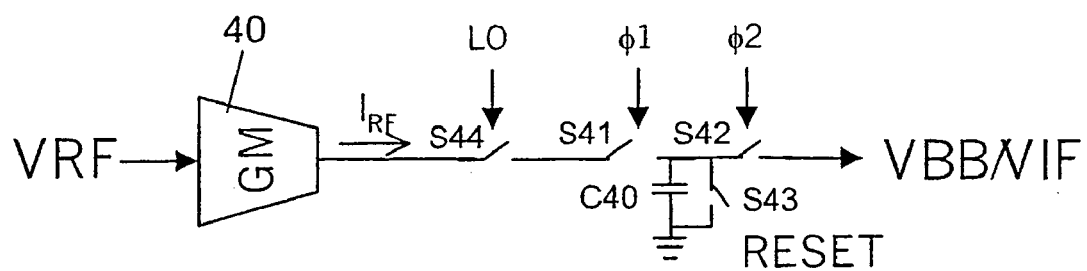
FIG. 4 illustrates the principle of current mode sampling with frequency down-conversion.
Figure 5:
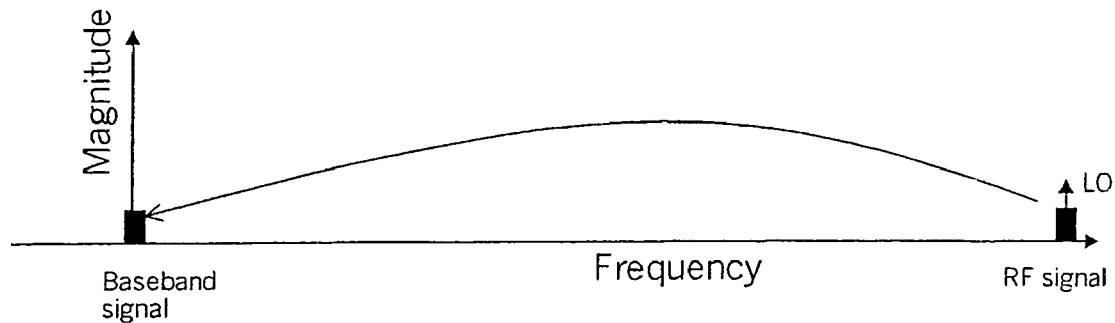
FIG. 5 illustrates a frequency down-conversion.
Figure 6:
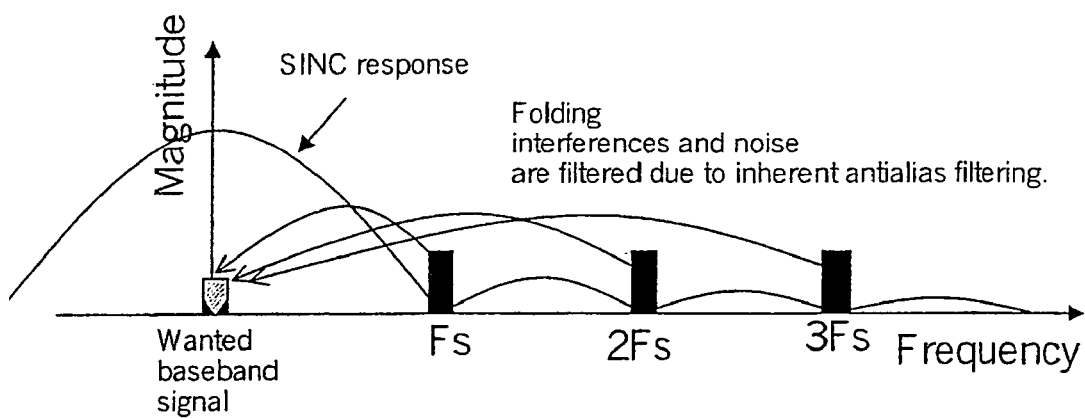
FIG. 6 illustrates the inherent anti-alias filtering of a current mode sampling.
Figure 7:
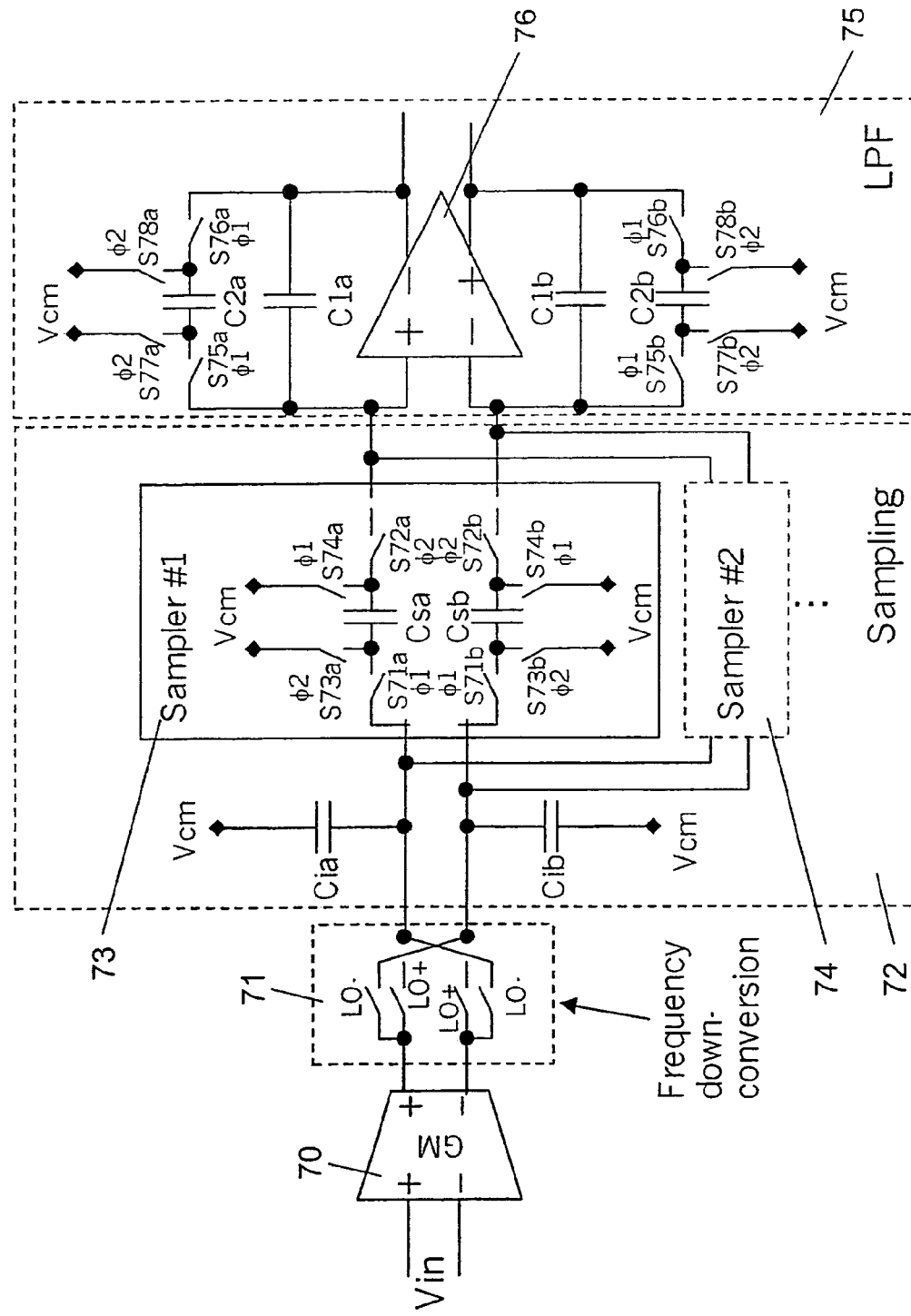
FIG. 7 is a schematic diagram of a known circuit for a passive current mode sampling with frequency downconversion and active integrator.
Figure 8:
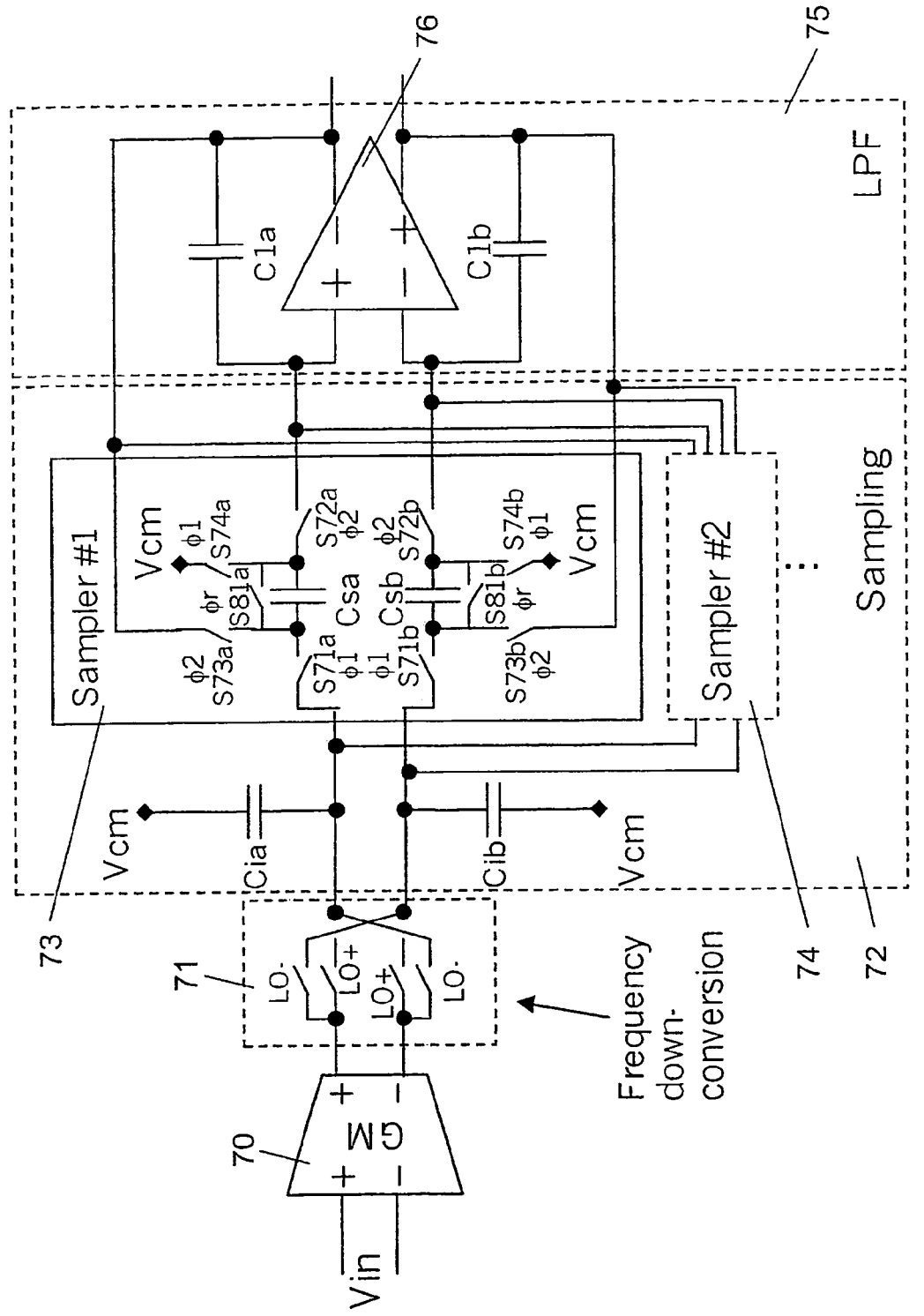
FIG. 8 is a schematic diagram of a known circuit for a passive current mode sampling with frequency downconversion and active low power integrator.
Figure 9:
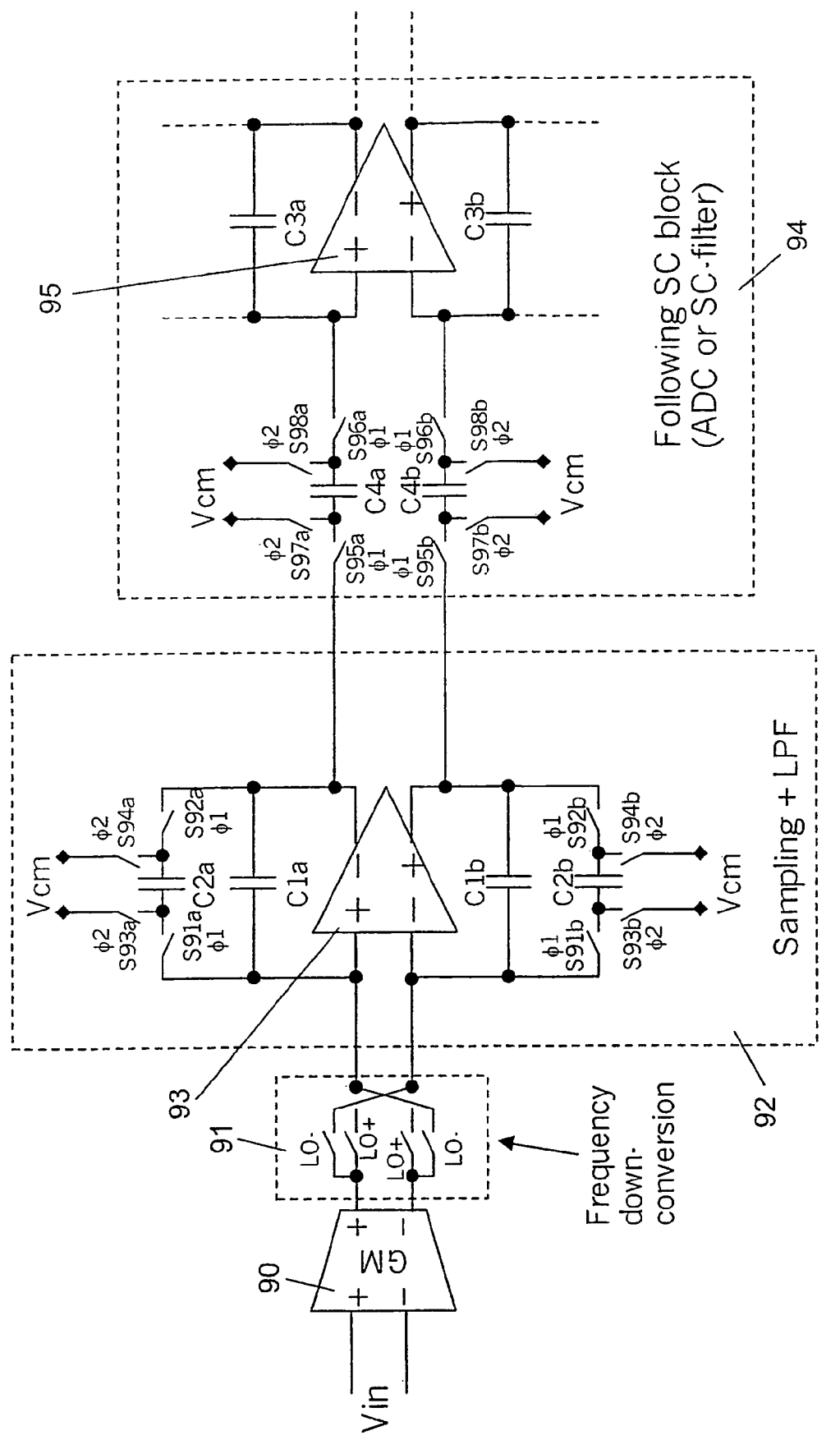
FIG. 9 is a schematic diagram of a known circuit for an active current mode sampling with frequency downconversion.

Capacitors C2a and C2b are referred to as shared switched capacitors, since in a conventional circuit topology, additional separate sampling capacitors are employed, which are usually connected to the output of the operational amplifier, like capacitors C4a and C4b in FIG. 9. Because such separate sampling capacitors are omitted in the inventive circuit, the capacitive load of the operational amplifier 103 is reduced. This results in a lower power consumption compared to a conventional active current mode sampling, like the active current mode sampling in the circuit of FIG. 9. Since the total number of the components in the sampling circuitry is moreover smaller than in a conventional circuit, the total thermal noise contribution of the sampling capacitors (kT/C) is also reduced.

It is another advantage of the sampling circuit of FIG. 10 that voltage mode error signals of the operational amplifier 103, such as 1/f noise, DC offset and settling errors, are not sampled in full. The integrated sample, which is converted back into a voltage mode signal in sampling capacitor C2 and which is transferred to the following SC block 104, contains only a fraction of operational amplifier related errors compared to conventional circuits. The reason is that these errors are not sampled by capacitor C2, as capacitor C2 is connected between input and output of operational amplifier 103. In a conventional circuit, in contrast, such errors are sampled by the separate sampling capacitor, since such a separate sampling capacitor is connected only to the output of the operational amplifier.

In the circuit of FIG. 10, the operational amplifier related errors see a gain close to unity, as the source impedance formed by the transconductance element 100 and mixer 101 is relatively high compared to the impedances that define the gain. On the other hand, the signal gain can be set independently from the noise gain with the product of the voltage gain of an LNA (not shown) arranged before the transconductance element 100, the transconductance of the transconductance element 100 and the effective resistance of shared switched capacitor C2. Thus, some of the requirements on the operational amplifier 103 are relaxed. This enables a more cost-effective implementation, as the error contribution of the operational amplifier is negligible in the inventive sampling scheme.

Figure 11:
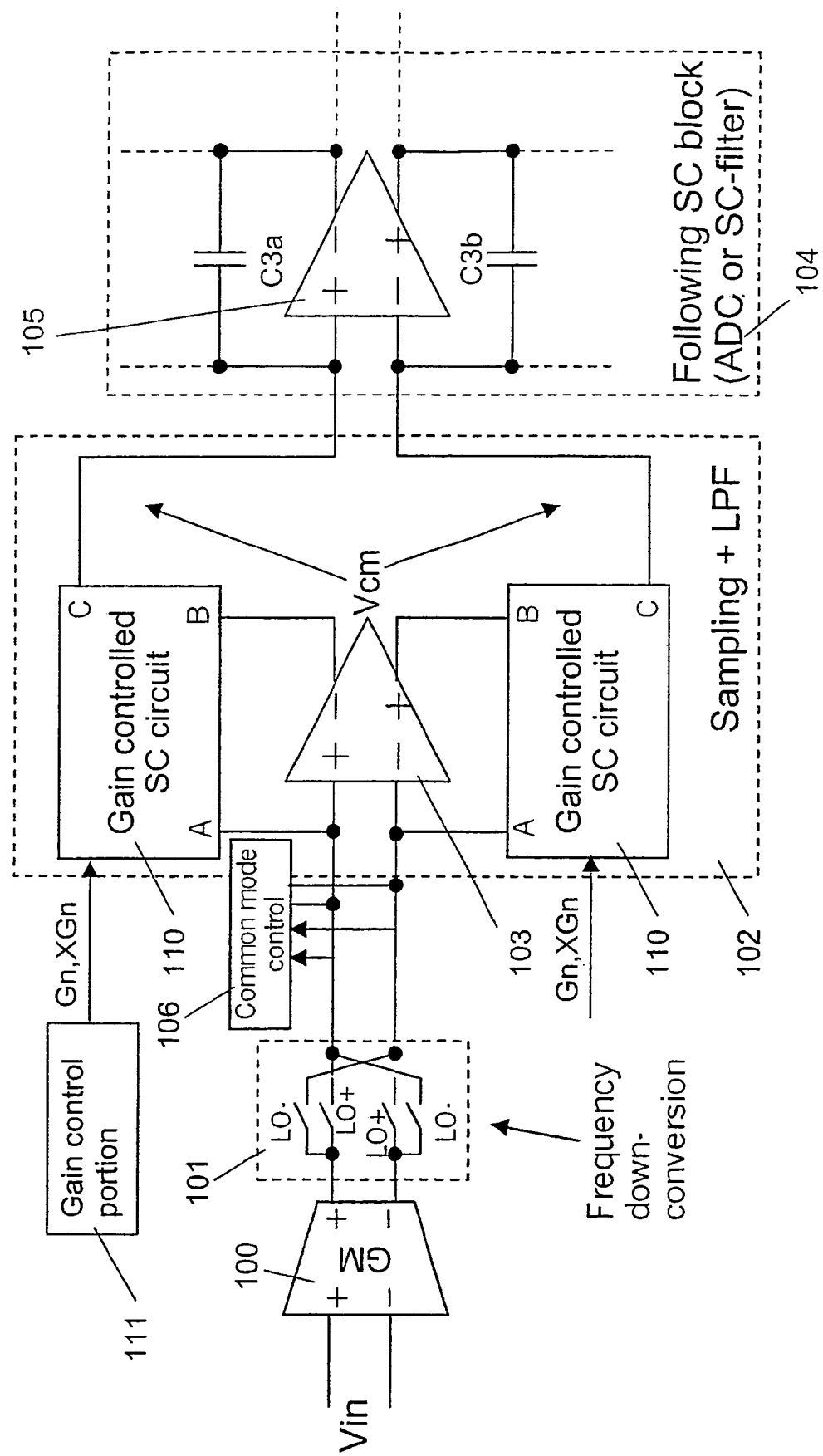
FIG. 11 is a schematic diagram of a circuit for an active low power current mode sampling with gain control and frequency downconversion according to an embodiment of the invention.

FIG. 11 presents an active current mode sampling circuit, in which the signal gain can be controlled. The circuit is identical to the one in FIG. 10, except that gain controlled SC circuits 110 are provided, which realize the functions of the capacitors C1 and C2 and the switches S101 to S104 of FIG. 10 in a way that the signal gain can be controlled. The gain controlled SC circuits 110 have a first terminal A connected to an input of operational amplifier 103, a second terminal B connected to an output of operational amplifier 103, and a third terminal C connected to an output of the sampling and LPF portion 102. In addition, a gain control portion 111 is provided, which provides gain setting signals Gn, XGn to the gain controlled SC circuits 110 in accordance with a desired gain. Each of the gain setting signals XGn is an inverted version of the respective gain setting signal Gn. For example, when G1=1 then XG1=0. In the following examples, the schematics are drawn and the gain setting signals are defined in such a way that the gain setting signals Gn control the attenuation.

A gain control can be added to the current mode sampling by simply controlling the value of the sampling capacitor C2 of FIG. 10 in the gain controlled SC circuit 110 of FIG. 11. However, changing the value of the sampling capacitor C2 also moves the corner frequency of the entire SC integrator of the sampling and LPF portion 102.

If the frequency response of the SC integrator is required to stay constant, the ratio of the shared sampling capacitor C2 and the continuous time capacitor C1 has to be kept constant. This can be achieved with a gain control which is shown in detail in FIG. 12, and which can be used in the gain controlled SC circuit 110 of the current mode sampling circuit of FIG. 11.

Figure 12:
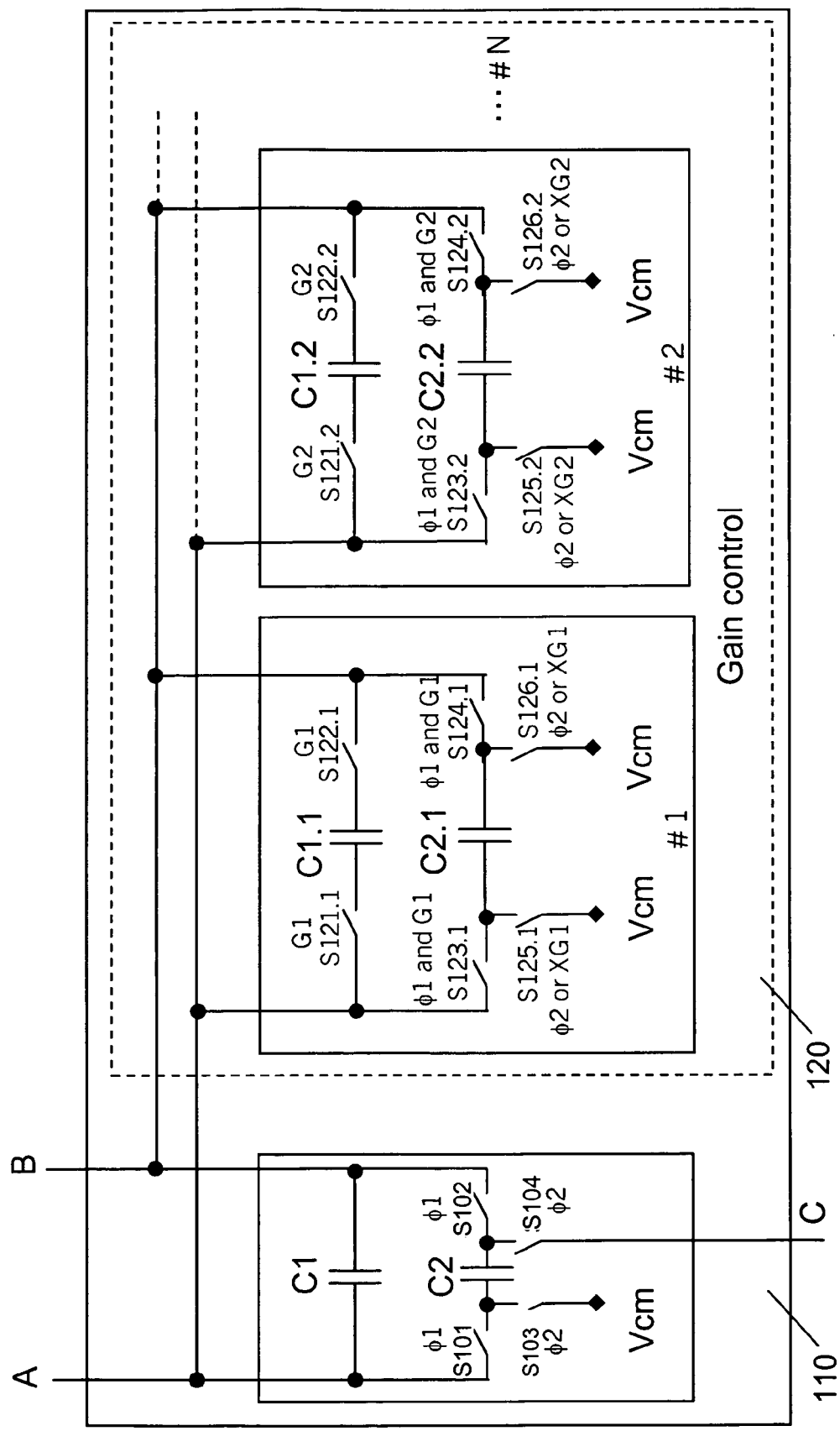
FIG. 12 is a schematic diagram of a first possible gain control circuit for the circuit of FIG. 11.

In FIG. 12, capacitor C1 is arranged between terminals A and B, and a series connection of switch S101, capacitor C2 and switch S102 are arranged in parallel to capacitor C1. The connection between switch S101 and capacitor C2 is connected via a switch S103 to ground Vcm, and the connection between capacitor C2 and switch S102 is connected via a switch S104 to terminal C. As in FIG. 10, switches S101 and S102 are closed during clock phases φ1, while switches S103 and S104 are closed during clock phases φ2.

In addition, a series connection of a switch S121.1, a capacitor C1.1 and a switch S122.1 is arranged between terminals A and B, in parallel with a series connection of a switch S123.1, a capacitor C2.1 and a switch S124.1. The connection between switch S123.1 and capacitor C2.1 is connected via a switch S125.1 to ground Vcm, and the connection between capacitor C2.1 and switch S124.1 is connected via a switch S126.1 to ground Vcm. Switches S121.1 and S122.1 are closed constantly in case of a gain setting signal G1, switches S123.1 and S124.1 are closed in case of a gain setting signal G1 during clock phases φ1, and switches S125.1 and S126.1 are closed in case of a gain setting signal XG1 or during clock phases φ2. Alternatively, switches S125.1 and S126.1 could be closed only in case of a gain setting signal XG1 during clock phases φ2. The difference is that capacitor C2.1 would not be short circuited to ground Vcm when G1 is not active, instead it would be floating.

Further in addition, a series connection of a switch S121.2, a capacitor C1.2 and a switch S122.2 is arranged between terminals A and B, in parallel with a series connection of a switch S123.2, a capacitor C2.2 and a switch S124.2. The connection between switch S123.2 and capacitor C2.2 is connected via a switch S125.2 to ground Vcm, and the connection between capacitor C2.2 and switch S124.2 is connected via a switch S126.2 to ground Vcm. Switches S121.2 and S122.2 are closed in case of a gain setting signal G2, switches S123.2 and S124.2 are closed in case of a gain setting signal G2 during clock phases φ1, and switches S125.2 and S126.2 are closed in case of a gain setting signal XG2 or during clock phases φ2.

Further similar arrangements of capacitors C1.$n$ and C2.$n$, with n=3 to N, are added in parallel between terminals A and B. These capacitors C1.$n$ and C2.$n$ are switched based on gain setting signals Gn and XGn, with n=3 to N, just like capacitors C1.1, C2.1, C1.2 and C2.2 are switched based on gain setting signals G1, XG1, G2 and XG2.

The value of capacitors C1.$n$, with n=1 to N, is the same as the value of capacitor C1, and the value of capacitors C2.$n$, with n=1 to N, is the same as the value of capacitor C2. Thus, the largest total capacitance Ctot which can be added to the original capacitance by providing gain setting signals G1, XG1, G2 and XG2 etc. is Ctot=N*(C1+C2). The components enabling the gain control are placed in FIG. 12 within a rectangle 120.

A drawback of a gain control of FIG. 12 is that if a large attenuation is needed in the gain control circuit, the size of both the continuous time capacitor C1 and the switched capacitor C2 will become very large.

Figure 13:
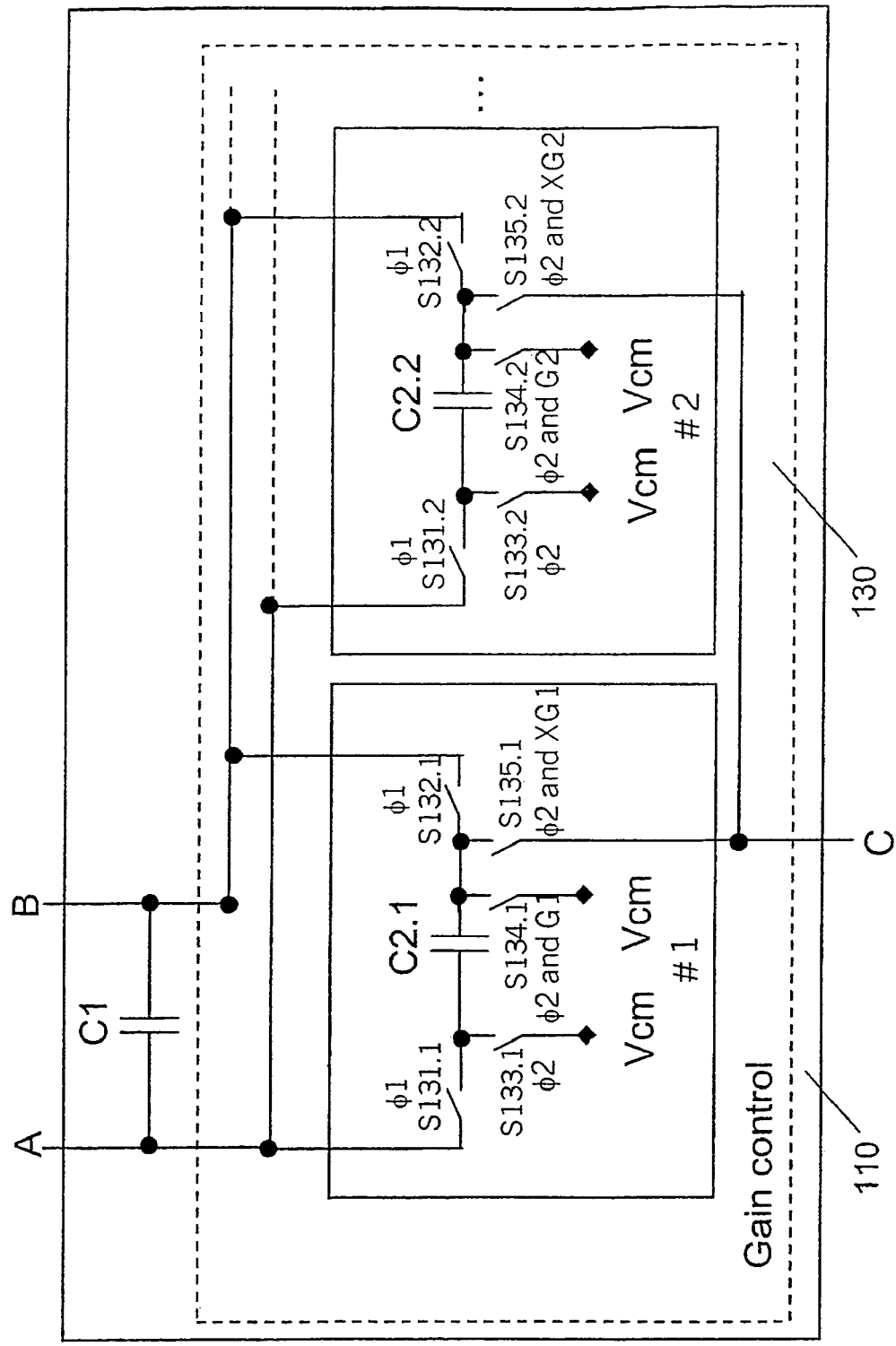
FIG. 13 is a schematic diagram of a second possible gain control circuit for the circuit of FIG. 11.

An improved kind of gain control resulting in a smaller capacitor area, which can equally be used in the gain controlled SC circuit 110 of FIG. 11, is shown in FIG. 13.

In this approach, a certain total capacitance Ctot of Ctot=C1+C2 is used. The shared sampling capacitor C2 is divided in to N smaller units C2.$n$, with n=1 to N, such that C2=C2.1+C2.2+ . . . +C2.N.

In the circuit of FIG. 13, capacitor C1 is arranged again between terminals A and B. N series connections of a switch S131.$n$, a capacitor C2.$n$ and a switch S132.$n$, with n=1 to N, are connected in parallel to capacitor C1. The connection between a respective switch S131.$n$ and a respective capacitor C2.$n$ is connected via a respective switch S133.$n$, with n=1 to N, to ground Vcm. The connection between a respective capacitor C2.$n$ and a respective switch S132.$n$ is connected on the one hand via a switch S134.$n$, with n=1 to N, to ground Vcm, and on the other hand via a switch 135.$n$, with n=1 to N, to terminal C. The components enabling the gain control are placed in FIG. 12 within a rectangle 130.

Figure 14:
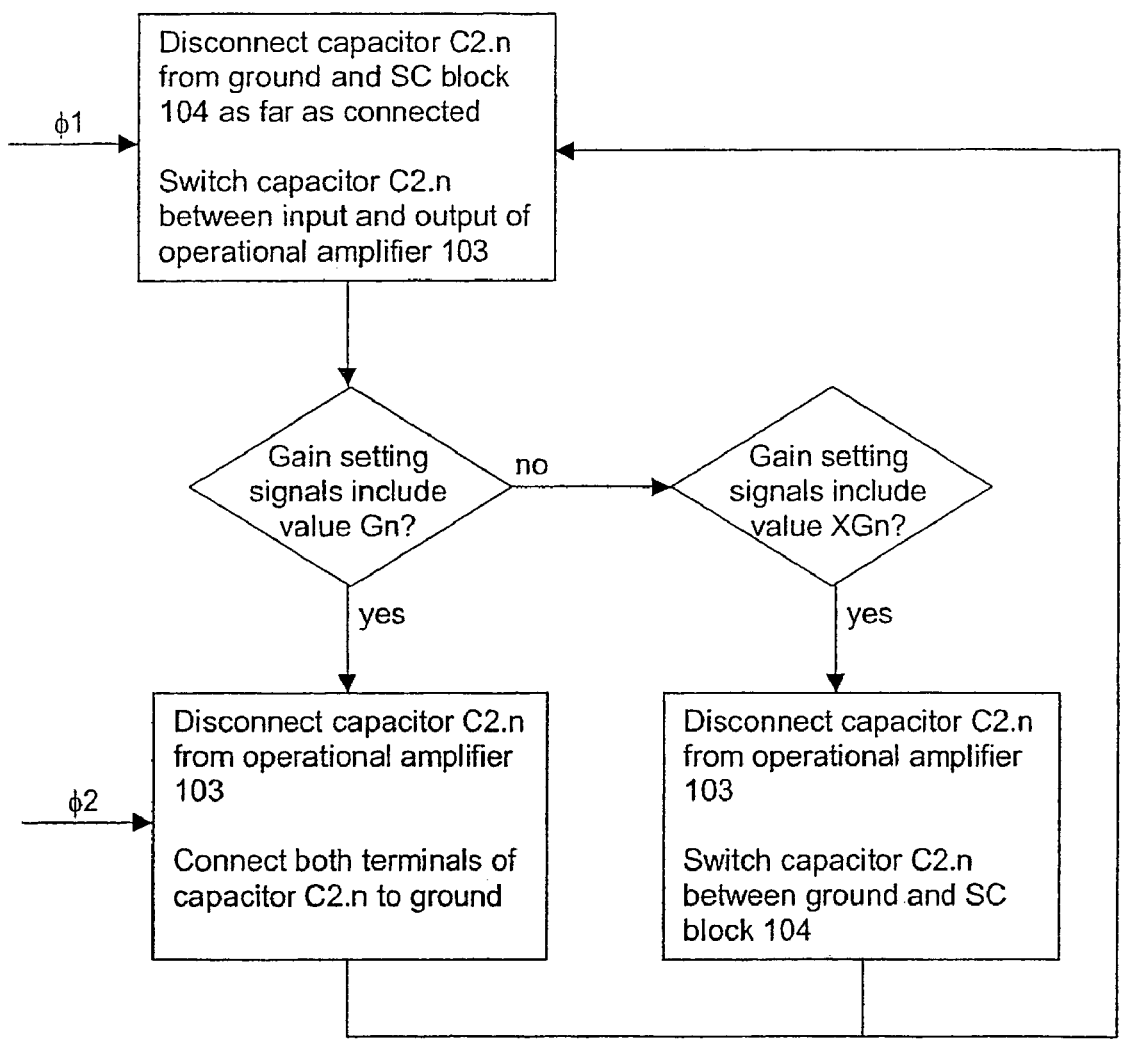
FIG. 14 is a flow chart illustrating the gain control in the circuit of FIG. 13.

The switching of the capacitors C2.$n$ in the gain control of FIG. 13 is illustrated in the flow chart of FIG. 14.

Switches S131.n and 132.n are closed during a respective charging clock phase φ1 so that all capacitors C2.n are switched between input and output of operational amplifier 103. During the charging clock phase φ1, thus the entire capacitor C2 is connected in parallel to capacitor C1 and charged. At the same time, all other switches S133.n to S135.n are opened.

During a subsequent discharging clock phases φ2, switches S131.n and 132.n are then opened again. Instead, switches 133.n are closed during this discharging clock phases φ2. Switches 134.n are closed during clock phases φ2, if at the same time a corresponding gain setting signal Gn, with n=1 to N, is present. Switches 135.n are closed during clock phases φ2, if at the same time a corresponding gain setting signal XGn, with n=1 to N, is present. Thus, a capacitor C2.n is connected with both terminals to ground, if a gain setting signal Gn is present, which results in a pure discharging of this capacitor C2.n. A capacitor C2.n is switched between ground and SC block 104, in contrast, if a gain setting signal XGn is present, whereby the charge of the capacitor C2.n is transferred to SC block 104, while the capacitor C2.n is discharged at the same time.

Thus, the number of the capacitor units C2.n transferring the integrated signal to the following SC block 104 is controlled with the gain setting signals G1, XG1, G2 and XG2, etc.

It is to be noted that the described embodiment constitutes only one of a variety of possible embodiments of the invention.

The invention claimed is:

1. Active current mode sampling circuit comprising:
an operational amplifier;
at least one switched capacitor;
first switching elements for switching said at least one switched capacitor between an input and an output of said operational amplifier during charging phases and for disconnecting said at least one switched capacitor from said input and said output of said operational amplifier in between said charging phases; and
second switching elements for connecting said at least one switched capacitor during discharging phases in between said charging phases to a subsequent stage, in order to provide a charge of said at least one switched capacitor to said subsequent stage, and for disconnecting said at least one switched capacitor from said subsequent stage, respectively, in between said discharging phases.

2. Active current mode sampling circuit according to claim 1, wherein said at least one switched capacitor includes a first switched capacitor which is switched by said switching elements between a first input and a first output of said operational amplifier during said charging phases, and a second switched capacitor which is switched by said switching elements between a second input and a second output of said operational amplifier during said charging phases.

3. Active current mode sampling circuit according to claim 1, further comprising at least one continuous time capacitor, which at least one continuous time capacitor is connected fixedly to an input and an output of said operational amplifier.

4. Active current mode sampling circuit according to claim 3, further comprising
at least one pair of a further switched capacitor and a further continuous time capacitor, both arranged in parallel to said at least one switched capacitor and to said at least one continuous time capacitor; and switching elements for connecting a continuous time capacitor of selected pairs of a further switched capacitor and a further continuous time capacitor continuously between said input and said output of said operational amplifier;
switching elements for switching a switched capacitor of said selected pairs of a further switched capacitor and a further continuous time capacitor between said input and said output of said operational amplifier during said charging phases and for disconnecting said at least one switched capacitor from said input and said output of said operational amplifier in between said charging phases; and
switching elements for switching a switched capacitor of said selected pairs of a further switched-capacitor and a further continuous time capacitor on both sides to ground during said discharging phases.

5. Active current mode sampling circuit according to claim 4, further comprising a gain control portion for selecting said pairs of a further switched capacitor and a further continuous time capacitor in accordance with a required gain.

6. Active current mode sampling circuit according to claim 1, wherein said at least one switched capacitor is divided into a plurality of switched capacitor units connected in parallel to each other, said second switching elements being controlled for connecting selected ones of said switched capacitor units to said subsequent stage during said discharging phases.

7. Active current mode sampling circuit according to claim 6, further comprising a gain control portion for selecting said switched capacitor units in accordance with a required gain.

8. Active current mode sampling circuit according to claim 1, further comprising a transconductance portion for converting a received voltage mode signal into a current mode signal and for providing said current mode signal to an input of said operational amplifier.

9. Active current mode sampling circuit according to claim 1, further comprising
a transconductance portion for converting a received voltage mode signal into a current mode signal; and
a frequency down-conversion portion for frequency down-converting a current mode signal output by said transconductance portion and for providing said frequency down-converted current mode signal to an input of said operational amplifier.

10. Device comprising an active current mode sampling circuit according to claim 1.

11. Method of operating an active current mode sampling circuit, which active current mode sampling circuit includes an operational amplifier and at least one switched capacitor, said method comprising:
switching said at least one switched capacitor between an input and an output of said operational amplifier during charging phases;
disconnecting said at least one switched capacitor from said input and said output of said operational amplifier in between said charging phases;
connecting said at least one switched capacitor during discharging phases in between said charging phases to a subsequent stage, in order to provide a charge of said at least one switched capacitor to said subsequent stage; and
disconnecting said at least one switched capacitor from said subsequent stage in between said discharging phases.

12. Method according to claim 11, wherein said at least one switched capacitor includes a first switched capacitor and a second switched capacitor, said method comprising switching said first switched capacitor between a first input and a first output of said operational amplifier during said charging phases, and switching said second switched capacitor between a second input and a second output of said operational amplifier during said charging phases.

13. Method according to claim 11, wherein said active current mode sampling circuit further includes at least one continuous time capacitor which is connected fixedly to an input and an output of said operational amplifier, and at least one pair of a further switched capacitor and a further continuous time capacitor, both arranged in parallel to said at least one switched capacitor and to said at least one continuous time capacitor, said method further comprising
 connecting a continuous time capacitor of selected pairs of a further switched capacitor and a further continuous time capacitor continuously between said input and said output of said operational amplifier;
 switching a switched capacitor of said selected pairs of a further switched capacitor and a further continuous time capacitor between said input and said output of said operational amplifier during said charging phases, and disconnecting said at least one switched capacitor from said input and said output of said operational amplifier in between said charging phases; and
 switching a switched capacitor of said selected pairs of a further switched capacitor and a further continuous time capacitor on both sides to ground during said discharging phases.

14. Method according to claim 13, further comprising selecting said pairs of a further switched capacitor and a further continuous time capacitor in accordance with a required gain.

15. Method according to claim 11, wherein said at least one switched capacitor is divided into a plurality of switched capacitor units connected in parallel to each other, said connecting of said at least one switched capacitor to a subsequent stage during said discharging phases comprising connecting selected ones of said switched capacitor units to a subsequent stage during said discharging phases.

16. Method according to claim 15, further comprising selecting said switched capacitor units in accordance with a required gain.

17. Method according to claim 11, further comprising converting a received voltage mode signal into a current mode signal and providing said current mode signal to an input of said operational amplifier.

18. Method according to claim 11, further comprising converting a received voltage mode signal into a current mode signal, frequency down-converting said current mode signal and providing said frequency down-converted current mode signal to an input of said operational amplifier.

19. Apparatus comprising:
 means for switching said at least one switched capacitor between an input and an output of said operational amplifier during charging phases;
 means for disconnecting said at least one switched capacitor from said input and said output of said operational amplifier in between said charging phases;
 means for connecting said at least one switched capacitor during discharging phases in between said charging phases to a subsequent stage, in order to provide a charge of said at least one switched capacitor to said subsequent stage; and
 means for disconnecting said at least one switched capacitor from said subsequent stage in between said discharging phases.

20. The apparatus of claim 19, further comprising means for switching said first switched capacitor between a first input and a first output of said operational amplifier during said charging phases, and means for switching said second switched capacitor between a second input and a second output of said operational amplifier during said charging phases.

* * * * *